(12) United States Patent
Aketa et al.

(10) Patent No.: US 9,472,688 B2
(45) Date of Patent: Oct. 18, 2016

(54) SEMICONDUCTOR DEVICE

(71) Applicant: ROHM CO., LTD., Kyoto-shi, Kyoto (JP)

(72) Inventors: Masatoshi Aketa, Kyoto (JP); Mineo Miura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/655,658

(22) PCT Filed: Dec. 25, 2013

(86) PCT No.: PCT/JP2013/084678
§ 371 (c)(1),
(2) Date: Jun. 25, 2015

(87) PCT Pub. No.: WO2014/104100
PCT Pub. Date: Jul. 3, 2014

(65) Prior Publication Data
US 2016/0005884 A1 Jan. 7, 2016

(30) Foreign Application Priority Data

Dec. 26, 2012 (JP) ................................. 2012-282882

(51) Int. Cl.
*H01L 29/872* (2006.01)
*H01L 29/861* (2006.01)
(Continued)

(52) U.S. Cl.
CPC ......... *H01L 29/872* (2013.01); *H01L 29/0615* (2013.01); *H01L 29/0619* (2013.01);
(Continued)

(58) Field of Classification Search
CPC ........... H01L 29/0615; H01L 29/0619; H01L 29/872; H01L 29/1608; H01L 29/6606; H01L 29/6609; H01L 29/66143; H01L 29/2003
See application file for complete search history.

(56) References Cited

U.S. PATENT DOCUMENTS

| 6,855,970 B2 * | 2/2005 | Hatakeyama ....... H01L 29/0615 257/164 |
| 2005/0077591 A1 | 4/2005 | Fukuda et al. |

FOREIGN PATENT DOCUMENTS

| JP | 2005-79339 | 3/2005 |
| JP | 2006-318956 | 11/2006 |

(Continued)

OTHER PUBLICATIONS

International Search Report, Apr. 15, 2014; PCT/JP2013/084678.

*Primary Examiner* — Jose R Diaz
(74) *Attorney, Agent, or Firm* — Hamre, Schumann, Mueller & Larson, P.C.

(57) ABSTRACT

A semiconductor device according to the present invention includes a semiconductor layer, a trench formed selectively in an obverse surface portion of the semiconductor layer and defining a unit cell of predetermined shape in the obverse surface portion, a second conductivity type layer formed to conform to a portion or an entirety of an inner surface of the trench, an obverse surface layer of a first conductivity type formed so as to be exposed from an obverse surface of the semiconductor layer in the unit cell, a reverse surface layer of the first conductivity type formed so as to be exposed from a reverse surface of the semiconductor layer, a drift layer of the first conductivity type formed between the obverse surface layer and the reverse surface layer of the semiconductor layer and being of lower concentration than the obverse surface layer and the reverse surface layer, a first electrode contacting the obverse surface layer and forming an ohmic contact with the obverse surface layer, and a second electrode contacting the reverse surface layer and forming an ohmic contact with the reverse surface layer.

12 Claims, 8 Drawing Sheets

(51) Int. Cl.

| | | |
|---|---|---|
| *H01L 29/66* | (2006.01) | |
| *H01L 29/06* | (2006.01) | |
| *H01L 29/16* | (2006.01) | |
| *H01L 29/20* | (2006.01) | |
| *H01L 29/36* | (2006.01) | |
| *H01L 29/24* | (2006.01) | |

(52) U.S. Cl.
CPC ....... *H01L29/1608* (2013.01); *H01L 29/2003* (2013.01); *H01L 29/36* (2013.01); *H01L 29/6606* (2013.01); *H01L 29/6609* (2013.01); *H01L 29/66143* (2013.01); *H01L 29/861* (2013.01); *H01L 29/1602* (2013.01); *H01L 29/24* (2013.01)

(56) References Cited

FOREIGN PATENT DOCUMENTS

| | | |
|---|---|---|
| JP | 2008-130913 | 6/2008 |
| JP | 2011-9797 | 1/2011 |

\* cited by examiner

SEMICONDUCTOR DEVICE

FIELD OF THE ART

The present invention relates to a semiconductor device.

BACKGROUND ART

From before, semiconductor power devices for use chiefly in systems in various power electronics fields, such as motor control systems, power conversion systems, have been the target of attention. As semiconductor power devices, SiC Schottky barrier diodes are known (for example, Patent Documents 1 and 2).

PRIOR ART DOCUMENTS

Patent Documents

Patent Document 1: Japanese Patent Application Publication No. 2005-79339

Patent Document 2: Japanese Patent Application Publication No. 2011-9797

SUMMARY OF THE INVENTION

Means for Solving the Problem

A semiconductor device according to the present invention includes a semiconductor layer, a trench formed selectively in an obverse surface portion of the semiconductor layer and defining a unit cell of predetermined shape in the obverse surface portion, a second conductivity type layer formed to conform to a portion or an entirety of an inner surface of the trench, an obverse surface layer of a first conductivity type formed so as to be exposed from an obverse surface of the semiconductor layer in the unit cell, a reverse surface layer of the first conductivity type formed so as to be exposed from a reverse surface of the semiconductor layer, a drift layer of the first conductivity type formed between the obverse surface layer and the reverse surface layer of the semiconductor layer and being of lower concentration than the obverse surface layer and the reverse surface layer, a first electrode contacting the obverse surface layer and forming an ohmic contact with the obverse surface layer, and a second electrode contacting the reverse surface layer and forming an ohmic contact with the reverse surface layer.

With this arrangement, both the first electrode and the second electrode form ohmic contacts with the semiconductor layer, and therefore by applying a bias between the electrodes, a current can be made to flow between the obverse surface layer and the reverse surface layer with a low rising voltage (forward voltage). The current can be cut off by applying an appropriate bias between the drift layer and the second conductivity type layer.

A case where a p type layer is formed at an inner surface of a trench in an n type drift layer shall now be described as an example. A depletion layer formed from the pn junction portion spreads inside the unit cell to cut off the current flowing between the obverse surface layer and the reverse surface layer. On the other hand, when a bias such that the p type layer side becomes positive is applied between the p type layer and n type drift layer, the depletion layer that spreads inside the unit cell is reduced in width to enable securing of a current path inside the unit cell.

Also, generation of a reverse leakage current when the current is cut off by the depletion layer (when a reverse bias is applied) can be reduced because the unit cell is defined by the trench and the second conductivity type layer is formed at the inner surface of the trench.

Preferably, the first electrode is formed to cover the obverse surface of the semiconductor layer and includes an embedded portion that is embedded in the trench.

With this arrangement, the obverse surface layer and the second conductivity type layer can be short-circuited and made equipotential via the embedded portion. A reverse bias applied between the obverse surface layer and the reverse surface layer can thereby be used to apply a bias that spreads the depletion layer between the drift layer and the second conductivity type layer.

A case where the p type layer is formed at the inner surface of the trench in the n type drift layer, the obverse surface layer is an anode, and the reverse surface layer is a cathode shall now be described as an example. When a bias such that the anode side becomes positive is applied between the anode and the cathode, this means that a forward bias is applied to the pn junction portion at an interface of the p type layer and the n type drift layer. Here, the depletion layer does not spread to a degree of cutting off the current path in the unit cell and a current thus flows between the anode and the cathode. On the other hand, when a bias such that anode side becomes negative is applied between the anode and the cathode (reverse bias application), a negative bias is also applied to the p type layer via the embedded portion. By using the negative bias, the depletion layer formed from the pn junction portion can be spread inside the unit cell to cut off the current flowing between the anode and the cathode. The rectifying operation can thus be performed more simply.

The second conductivity type layer may be formed so that the drift layer is exposed from a portion of the inner surface of the trench and the embedded portion may form a Schottky junction with the exposed drift layer.

With this arrangement, depletion layers that differ mutually in the manner of spreading can be made to spread from a pn junction portion at an interface of the second conductivity type layer and the drift layer and from a Schottky junction portion at an interface of the embedded portion and the drift layer. Diverse rectifying operations can thereby be performed.

The semiconductor device may further include an insulating film formed on a portion of the inner surface of the trench.

With this arrangement, depletion layers that differ mutually in the manner of spreading can be made to spread from the pn junction portion at the interface of the second conductivity type layer and the drift layer and from a junction portion at an interface of the insulating layer and the drift layer. Diverse rectifying operations can thereby be performed.

Preferably, the second conductive type layer includes a high concentration layer that is formed at a portion exposed from the inner surface of the trench and has a higher concentration compared to other portions of the second conductivity type layer.

With this arrangement, an ohmic contact can be formed between the embedded portion and the high concentration layer.

Preferably, the embedded portion includes polysilicon, tungsten (W), titanium (Ti), or an alloy of the above materials.

These materials have good embedding properties and can thus improve step coverage of the embedded portion.

The semiconductor layer may include a wide bandgap semiconductor with a dielectric breakdown field of not less than 1.5 MV/cm. Specifically, it preferably includes silicon carbide (SiC), gallium nitride (GaN), gallium oxide ($Ga_2O_3$) or diamond.

Preferably, the obverse surface of the semiconductor layer is defined into an active region in which the unit cell is disposed and an outer peripheral region surrounding the active region, and the semiconductor device further includes a removal region formed in the obverse surface portion of the semiconductor layer in the outer peripheral region and a termination structure of the second conductivity type that is formed to conform to a portion or an entirety of an inner surface of the removal region and is disposed at a position deeper than the obverse surface layer.

With this arrangement, electric field concentration at a bottom portion of the trench can be moderated by a depletion layer formed from a pn junction portion at an interface of the termination structure and the drift layer. The generation of a reverse leakage current at the trench bottom portion can thereby be reduced.

MODES FOR CARRYING OUT THE INVENTION

Preferred embodiments of the present invention shall now be described in detail with reference to the attached drawings.

Figure 1:
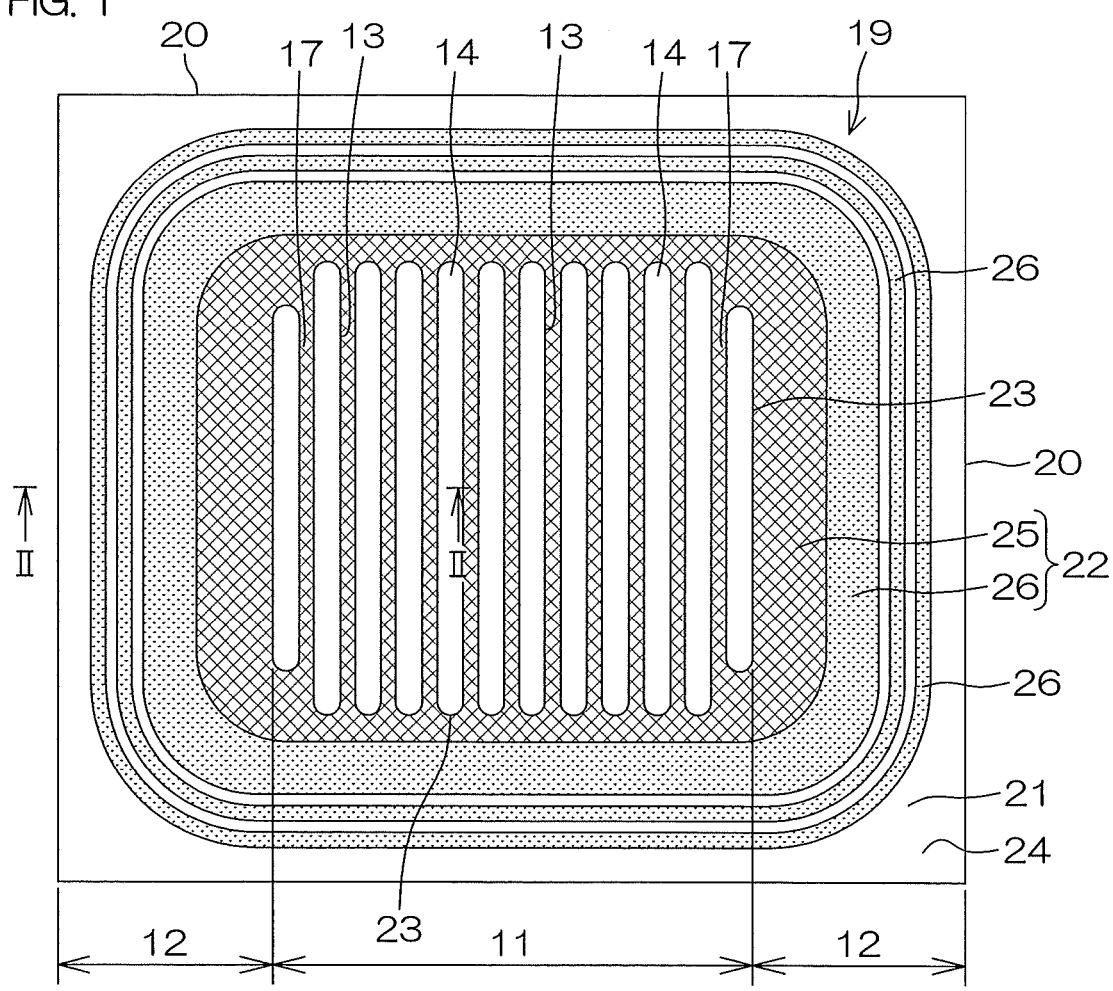
FIG. 1 is a schematic plan view of a semiconductor device according to a first preferred embodiment of the present invention.
Figure 2:
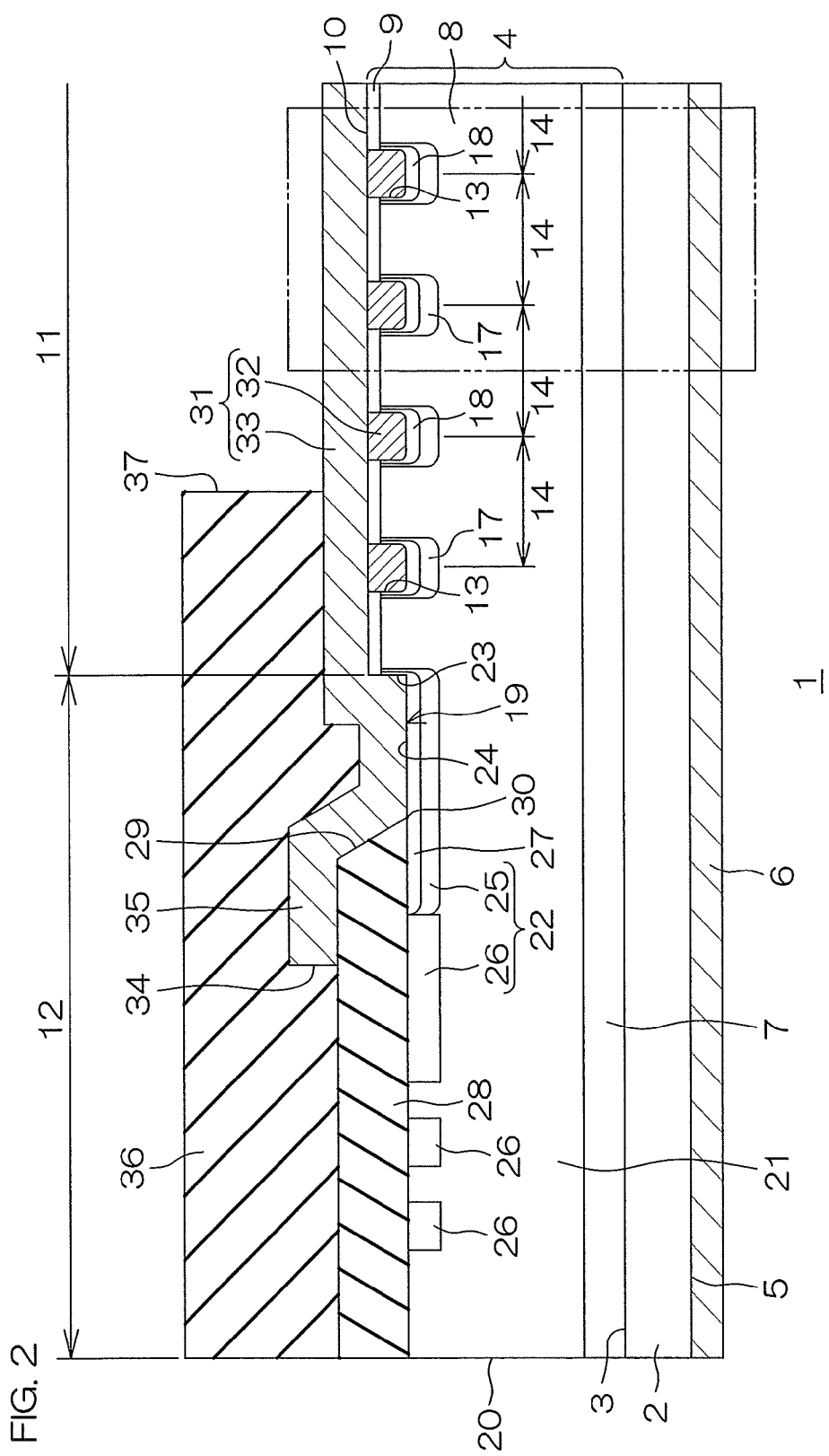
FIG. 2 is a sectional view taken along section line II-II of FIG. 1.
Figure 3:
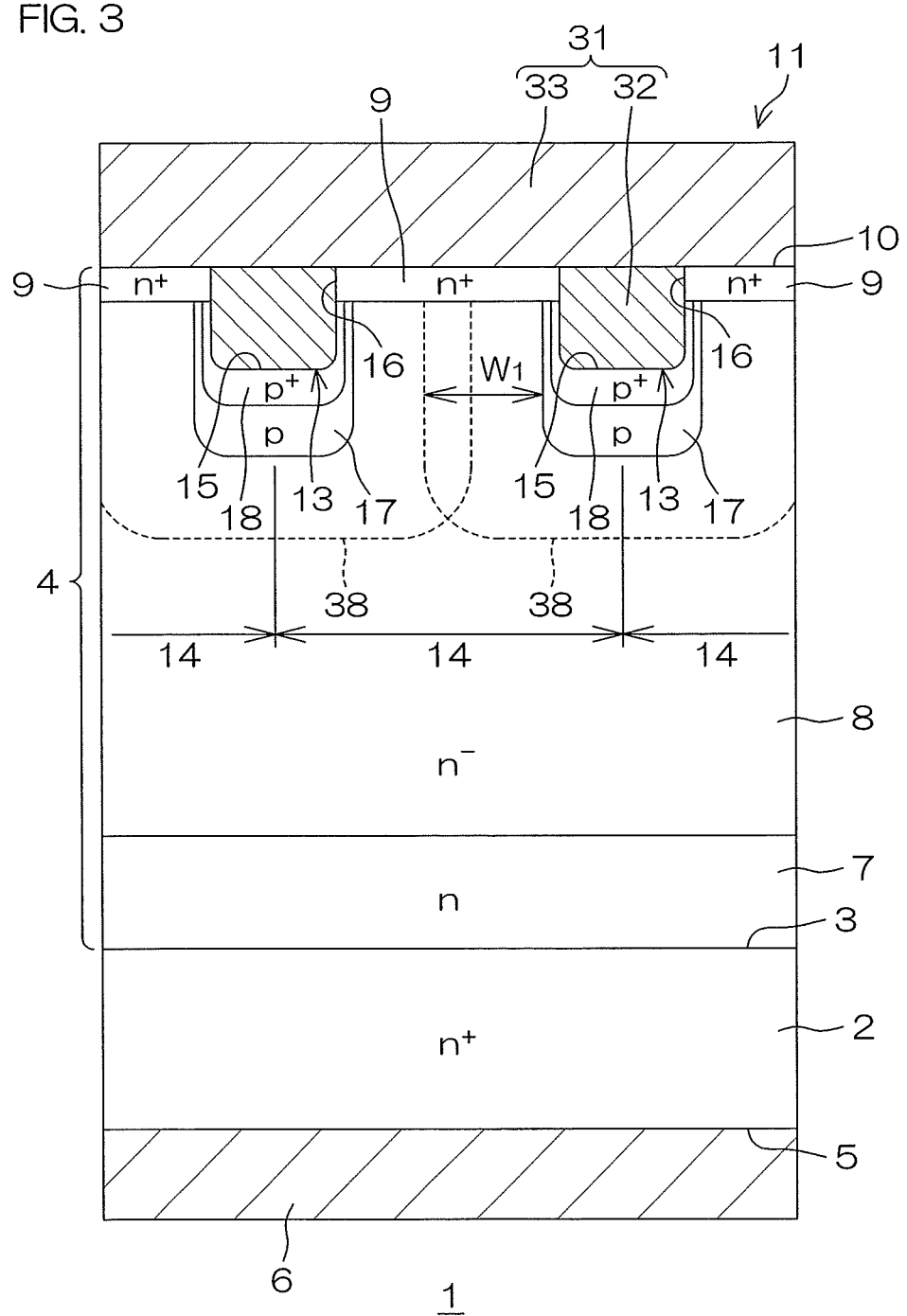
FIG. 3 is an enlarged view of a portion surrounded by alternate long and two short dashes lines in FIG. 2.

FIG. 1 is a schematic plan view of a semiconductor device 1 according to a first preferred embodiment of the present invention. FIG. 2 is a sectional view taken along section line II-II of FIG. 1. FIG. 3 is an enlarged view of a portion surrounded by alternate long and two short dashes lines in FIG. 2.

The semiconductor device 1 is a device adopting 4H-SiC (a wide bandgap semiconductor with a dielectric breakdown field of approximately 2.8 MV/cm and a bandgap width of approximately 3.26 eV). The wide bandgap semiconductor adopted in the semiconductor device 1 is not restricted to SiC and may be GaN, $Ga_2O_3$, or diamond, etc. GaN has a dielectric breakdown field of approximately 3 MV/cm and a bandgap width of approximately 3.42 eV. Diamond has a dielectric breakdown field of approximately 8 MV/cm and a bandgap width of approximately 5.47 eV.

The semiconductor device 1 includes an $n^+$ type substrate 2 of $n^+$ type SiC and being an example of a reverse surface layer of the present invention and an epitaxial layer 4 laminated on an obverse surface 3 of the $n^+$ type substrate 2. A cathode electrode 6, as an example of a second electrode of the present invention, is disposed on and so as to cover an entirety of a reverse surface 5 of the $n^+$ type substrate 2. The cathode electrode 6 forms an contact with the $n^+$ type substrate 2.

The $n^+$ type substrate 2 is a substrate having, for example, a (0001) plane (Si plane) as a principal surface. The epitaxial layer 4 that is laminated by epitaxial growth on the obverse surface 3 (principal surface) of the $n^+$ type substrate 2 is thus also laminated with a (0001) plane as the principal surface. In this case, the reverse surface 5 of the $n^+$ type substrate 2 is a (000-1) plane (C plane). With the $n^+$ type substrate 2, the obverse surface 3 may be a (000-1) plane and the reverse surface 5 may be a (0001) plane. Also, the $n^+$ type substrate 2 preferably has an off angle of 0° to 10°.

The epitaxial layer 4 includes an n type buffer layer 7, an $n^-$ type drift layer 8, and an $n^+$ type obverse surface layer 9 that are successively grown from the $n^+$ type substrate 2 side.

An active region 11 and an outer peripheral region 12, surrounding the active region 11, are set on an obverse surface 10 of the epitaxial layer 4. In the active region 11, a plurality of mutually spaced trenches 13 are formed in an obverse surface portion of the epitaxial layer 4. The trenches 13 define a plurality of unit cells 14 in the active region 11. In the present preferred embodiment, the trenches 13 of a stripe pattern define a plurality of rectilinear unit cells 14 in the active region 11. The pattern of the trenches 13 is not restricted to a stripe pattern and may, for example, be of a lattice pattern. In this case, a plurality of mesa-shaped unit cells 14 are defined in respective window portions of the trenches 13 of the lattice pattern and as a whole, the unit cells 14 are arranged in the form of an array.

Each trench 13 is formed to penetrate through the $n^+$ type obverse surface layer 9 in a thickness direction of the epitaxial layer 4 from the obverse surface 10 of the epitaxial layer 4 and a deepest portion thereof is positioned in a middle portion of the $n^-$ type drift layer 8. Each unit cell 14 is thereby made to include a base portion, of the $n^-$ type drift layer 8, and an obverse surface portion, of the $n^+$ type obverse surface layer 9 disposed on the base portion and formed so as to be exposed from the obverse surface 10 of the epitaxial layer 4.

At a bottom surface 15 and side surfaces 16 of each trench 13 (hereinafter, these may be referred to collectively as the "inner surface of the trench 13"), a p type layer 17 (cross-hatched region in FIG. 1 (excluding a region of a p type JTE structure 22 to be described below)) is formed, as an example of a second conductivity type layer of the present invention, so as to conform to the inner surface of the trench 13. The p type layer 17 is formed across the entire bottom surface 15 and at a portion of the side surfaces 16 of the trench 13 and contacts a lower edge of the $n^+$ type obverse surface layer 9 at an interface of the $n^-$ type drift layer 8 and the $n^+$ type obverse surface layer 9. In the present preferred embodiment, the p type layer 17 is formed so that the $n^-$ type drift layer 8 is not exposed from the bottom surface 15 and the side surfaces 16 of the trench 13. The p type layer 17 and the $n^+$ type obverse surface layer 9 are thereby exposed successively from a bottom portion of the trench 13 at the side surfaces 16 of the trench 13. A depth position of a boundary of the p type layer 17 and the $n^+$ type obverse surface layer 9 is matched with a depth position of an interface of the $n^-$ type drift layer 8 and the $n^+$ type obverse surface layer 9. Also, the p type layer 17 forms a pn junction portion with the n⁻ type drift layer 8.

Also, the p type layer 17 includes a p⁺ type contact layer 18 as an example of a high concentration layer of the present invention that is higher in concentration compared to other portions of p type layer 17. At an inner side spaced from a boundary of the p type layer 17 and the n⁻ type drift layer 8, the p⁺ type contact layer 18 is formed alongside the boundary at the bottom surface 15 and the side surfaces 16 of the trench 13.

A thickness of the p type layer 17 differs mutually between the bottom surface 15 and the side surfaces 16 of the trench 13. Specifically, a portion of the p type layer 17 in the bottom surface 15 is thicker than a portion in each side surface 16 and a difference in the thickness of the p type layer 17 is thereby provided between the bottom surface 15 and the side surfaces 16. The p⁺ type contact layer 18 included in the p type layer 17 is similarly provided with a difference in thickness between the bottom surface 15 and the side surfaces 16.

In the outer peripheral region 12, a removal region 19 is formed in the epitaxial layer 4 by etching the epitaxial layer 4 to a depth at which the n⁻ type drift layer 8 is exposed from the n⁺ type obverse surface layer 9. In the present preferred embodiment, the removal region 19 is formed to an annular shape surrounding the active region 11 so as to cross end portions at both sides in the longitudinal direction of the trenches 13 of the stripe pattern. The removal region 19 is thereby made continuous with the trenches 13 of the stripe pattern. That is, the removal region 19 is constituted by an extension portion of the stripe pattern. Also, an outer peripheral edge of the removal region 19 may be matched with an end surface 20 of the epitaxial layer 4 as shown in FIG. 1 or may be set at an inner side from the end surface 20 of the epitaxial layer 4 (not shown).

By the forming of the removal region 19, the drift layer 8 is made to have a lead-out portion 21 that is lead out from a periphery of the active region 11 to the end surface 20 of the epitaxial layer 4 in a lateral direction along the obverse surface 10 of the epitaxial layer 4. The lead-out portion 21 is a low step portion that is one step lower than the obverse surface 10 of the epitaxial layer 4.

Also in the outer peripheral region 12, the p type JTE (junction termination extension) structure 22 is formed as an example of a termination structure of the present invention in the n⁻ type drift layer 8. In the present preferred embodiment, the p type JTE structure 22 is formed to an annular shape surrounding the active region 11. Specifically, it is formed to conform to side surfaces 23 and a bottom surface 24 (upper surface of the lead-out portion 21) of the removal region 19 so as to span across from the unit cells 14 to the lead-out portion 21. The p type JTE structure 22 is thereby disposed at a deeper position than the n⁺ type obverse surface layer 9. The p type JTE structure 22 may be constituted of a plurality of rings spreading outward toward the end surface 20 of the epitaxial layer 4. In this case, portions between the plurality of rings may be mutually equal in dopant concentration or the dopant concentration may decrease toward the outer side.

In the present preferred embodiment, the p type JTE structure 22 is divided along a peripheral direction by a difference in dopant concentration and includes a first portion 25 (cross-hatched region (excluding the region of the p type layer 17) in FIG. 1) of relatively high concentration and a second portion 26 (dot-hatched region in FIG. 1) of concentration lower than the first portion 25.

The first portion 25 is disposed closer to the active region 11 than the second portion 26. In the first portion 25, the p type JTE structure 22 includes a p⁺ type contact layer 27 that is higher in concentration than other portions of the first portion 25. At an inner side spaced from a boundary of the p type JTE structure 22 and the n⁻ type drift layer 8, the p⁺ type contact layer 27 is formed alongside the boundary at the side surfaces 23 and the bottom surface 24 of the removal region 19.

The second portion 26 is constituted of a plurality of rings. An innermost peripheral ring of the second portion 26 may be in contact with the first portion 25 as shown in FIG. 1 and FIG. 2 or does not have to be in contact with the first portion 25 (not shown).

A field insulating film 28 is formed on the epitaxial layer 4. A contact hole 29 that selectively exposes the entirety of the active region 11 and a portion of the outer peripheral region 12 is formed in the field insulating film 28. In the present preferred embodiment, an outer peripheral edge 30 of the contact hole 29 is set closer to the active region 11 than a boundary of the first portion 25 and the second portion 26. The field insulating film 28 is thereby made to cover the entirety of the second portion 26 and a portion (for example, a peripheral end portion) of the first portion 25. Also, the contact hole 29 is preferably formed to a tapered shape that widens in width toward an opening end.

As an example of a first electrode of the present invention, an anode electrode 31 is formed on the field insulating film 28. The anode electrode 31 is formed to cover the entirety of the active region 11 exposed from the contact hole 29 and includes embedded portions 32 embedded in the trenches 13 and a planar portion 33 formed to conform to the obverse surface 10 of the epitaxial layer 4 so as to cover the embedded portions 32.

Each embedded portion 32 contacts the p⁺ type contact layer 18 and the n⁺ type obverse surface layer 9 at the inner surface of a trench 13 and forms ohmic contacts with the p⁺ type contact layer 18 and with the n⁺ type obverse surface layer 9.

The planar portion 33 contacts the n⁺ type obverse surface layer 9 at the obverse surface 10 of the epitaxial layer 4 and forms an ohmic contact with the n⁺ type obverse surface layer 9. Also, the planar portion 33 projects outside the contact hole 29 in a flange shape. In the present preferred embodiment, an outer peripheral edge 34 of the planar portion 33 of the anode electrode 31 is positioned further from the active region 11 than the boundary of the first portion 25 and the second portion 26 of the p type JTE structure 22. That is, the planar portion 33 of the anode electrode 31 has an overlap portion 35 which protrudes further toward the second portion 26 side than the boundary.

A surface protection film 36 is formed on a topmost surface of the semiconductor device 1. A pad opening 37, selectively exposing a portion of the anode electrode 31 as a pad, is formed in the surface protection film 36. A bonding wire, etc., is bonded to the anode electrode 31 via the pad opening 37.

Details of respective portions of the semiconductor device 1 shall now be described additionally.

The semiconductor device 1 is shaped as a chip having a square shape in a plan view. Its size is such that a length in each of up/down and right/left directions in the sheet surface of FIG. 1 is 0.5 mm to 20 mm. In other words, a chip size of the semiconductor device 1 is, for example, 0.5 mm/square to 20 mm/square.

A thickness of the n⁺ type substrate 2 is 50 μm to 700 μm, a thickness of the n type buffer layer 7 is 0.1 μm to 10 μm, a thickness of the n⁻ type drift layer 8 is 1 μm to 100 μm, and a thickness of the n⁺ type obverse surface layer 9 is 0.1 μm to 10 μm.

For example, N (nitrogen), P (phosphorus), As (arsenic), etc., may be used as an n type dopant used in respective portions of the semiconductor device 1 (the same applies hereinafter). On the other hand, B (boron), Al (aluminum), etc., may be used as the p type dopant.

The dopant concentration of the n⁺ type substrate 2 may be $1 \times 10^{18}$ to $1 \times 10^{20}$ cm⁻³, the dopant concentration of the n type buffer layer 7 may be $1 \times 10^{16}$ to $1 \times 10^{18}$ cm⁻³, the dopant concentration of the n⁻ type drift layer 8 may be $1 \times 10^{14}$ to $1 \times 10^{17}$ cm⁻³, and the dopant concentration of the n⁺ type obverse surface layer 9 may be $1 \times 10^{18}$ to $1 \times 10^{28}$ cm⁻³.

The dopant concentration of the p type layer 17 may be $1 \times 10^{16}$ to $1 \times 10^{19}$ cm⁻³ and the dopant concentration of each of the p⁺ type contact layers 18 and 27 may be $1 \times 10^{18}$ to $1 \times 10^{21}$ cm⁻³.

The dopant concentration of the first portion 25 of the p type JTE structure 22 may be $1 \times 10^{16}$ to $1 \times 10^{19}$ cm⁻³ and the dopant concentration of the second portion 26 may be $1 \times 10^{16}$ to $1 \times 10^{18}$ cm⁻³.

The distance (pitch) between centers of mutually adjacent trenches 13 may, for example, be 0.1 μm to 10 μm. Also, the depths of the trenches 13 and the removal region 19 may be the same.

As the material of the cathode electrode 6, for example, Ti/Ni/Au/Ag, etc., may be used.

As the material of the embedded portions 32 of the anode electrode 31, for example, polysilicon, tungsten (W), titanium (Ti), or an alloy of the above materials may be used. Among these, a p type polysilicon may be used favorably. These materials have good embedding properties and can thus improve step coverage of the embedded portions 32.

As the material of the planar portion 33 of the anode electrode 31, for example, Ti/Al, etc., may be used.

As the material of the field insulating film 28, for example, SiO₂ (silicon oxide), etc., may be used. Also, the field insulating film 28 may be formed, for example, by plasma CVD. A film thickness thereof may be 0.5 μm to 3 μm.

As the material of the surface protection film 36, for example, SiO₂ (silicon oxide), SiN (silicon nitride), polyimide, etc., may be used. Also, the surface protection film 36 may be formed, for example, by plasma CVD. A film thickness thereof may be approximately 8000 Å.

With the semiconductor device 1, the anode electrode 31 is in ohmic contact with the n⁺ type obverse surface layer 9, and the cathode electrode 6 is in ohmic contact with the n⁺ type substrate 2. Therefore, by applying a bias between the anode electrode 31 and the cathode electrode 6 (between an anode and a cathode) such that the anode side becomes positive, a current can be made to flow between the anode and the cathode with a low rising voltage (forward voltage). The current can be cut off by applying an appropriate bias between the p type layer 17 and the n⁻ type drift layer 8.

That is, when a bias such that the p type layer 17 side becomes negative is applied between the p type layer 17 and the n⁻ type drift layer 8, a reverse bias is applied to pn junction portions at interfaces of the p type layers 17 and the n⁻ type drift layer 8. Depletion layers 38 forming from the pn junction portions as shown by broken lines in FIG. 3 are thereby made to spread in the lateral direction along the obverse surface 10 of the epitaxial layer 4 and interiors of the unit cells 14 become filled with the depletion layers 38. The depletion layers 38 cut off the current between the anode and the cathode. On the other hand, when a bias such that the p type layer 17 side becomes positive is applied between the p type layers 17 and the n⁻ type drift layer 8, a width $W_1$ of each depletion layer 38 that spreads inside a unit cell 14 is reduced to enable securing of a current path inside the unit cell 14. A rectifying operation can thus be performed easily.

Also, concentration of electric field in the unit cells 14 can be moderated because the unit cells 14 are defined by the trenches 13 and the p type layer 17 is formed at the inner surface of each trench 13. Generation of a reverse leakage current when the current is cut off by the depletion layers 38 (when a reverse bias is applied) can thus be reduced.

Also, the embedded portions 32 of the anode electrode 31 are in ohmic contact with both the n⁺ type obverse surface layer 9 and the p type layer 17, and therefore the n⁺ type obverse surface layer 9 and the p type layer 17 can be short-circuited and made equipotential via the embedded portions 32. A reverse bias applied between the anode and the cathode can thereby be used to apply a bias that spreads the depletion layers 38 between the n⁻ type drift layer 8 and the p type layers 17. Specifically, as mentioned above, when a bias such that the anode side becomes positive is applied between the anode and the cathode, a forward bias is applied to the pn junction portion at the interface of the p type layer 17 and the n⁻ type drift layer 8. Here, the depletion layers 38 do not spread to a degree of cutting off the current path in each unit cell 14 and a current thus flows between the anode and the cathode. On the other hand, when a bias such that anode side becomes negative is applied between the anode and the cathode (reverse bias application), a negative bias is also applied to the p type layer 17 via the embedded portions 32. By using the negative bias, a reverse bias can be applied to the pn junction portion to spread the depletion layer 38 inside each unit cell 14 to cut off the current flowing between the anode and the cathode. The rectifying operation can thus be performed more simply.

Also with the semiconductor device 1, the p type JTE structure 22 is formed in the outer peripheral region 12, and electric field concentration at the bottom portion of each trench 13 (especially the trench 13 disposed at the outermost side) can thus be moderated by a depletion layer formed from a pn junction portion at an interface of the p type JTE structure 22 and the n⁻ type drift layer 8. The generation of a reverse leakage current at the trench 13 bottom portions can thereby be reduced.

Figure 4:
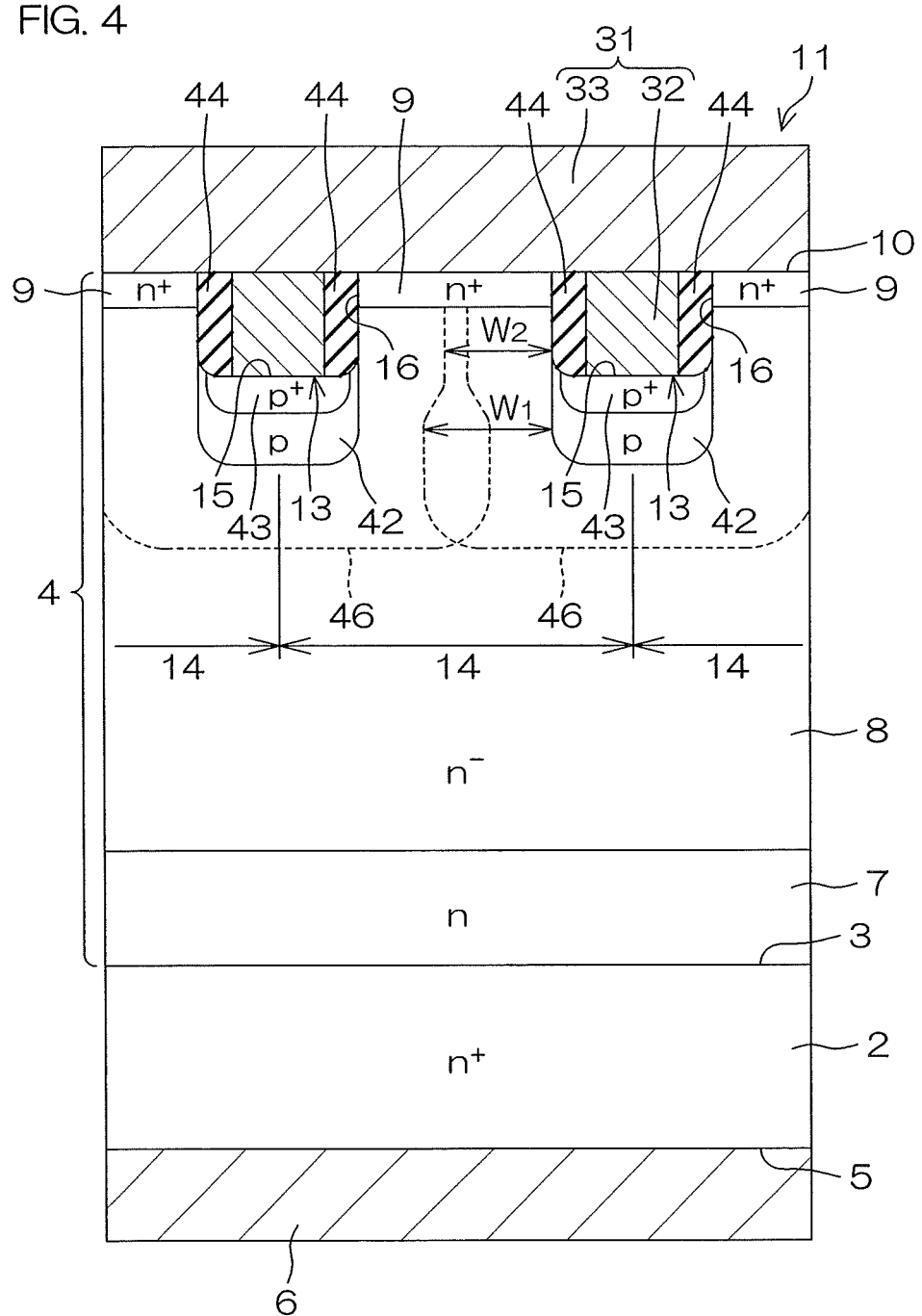
FIG. 4 is a schematic sectional view of a semiconductor device according to a second preferred embodiment of the present invention.

FIG. 4 is a schematic sectional view of a semiconductor device 41 according to a second preferred embodiment of the present invention. In FIG. 4, portions corresponding to respective portions shown in FIG. 3 described above are provided with the same reference symbols.

With the first preferred embodiment, the p type layer 17 is formed across the entire bottom surface 15 and at a portion of the side surfaces 13 of each trench 13 so that the n⁻ type drift layer 8 is not exposed from the side surfaces 16 of the trench 13. In contrast, the semiconductor device 41 of the second preferred embodiment includes a p type layer 42 formed at the bottom surface 15 of each trench 13 such that the n⁻ type drift layer 8 is selectively exposed from the side surfaces 16 of the trench 13. The p type layer 42 is formed, for example, with the same width as the trench 13 and along a longitudinal direction of the trench 13 at a lower region of the trench 13. Also, the p type layer 42 includes a p⁺ type contact layer 43 which, at an inner side spaced from a boundary of the p type layer 42 and the n⁻ type drift layer 8, is formed alongside the boundary at the bottom surface 15 of the trench 13.

Also, the semiconductor device 41 further includes insulating films 44 formed on the side surfaces 16 of the trenches 13. As the material of the insulating films 44, for example, SiO₂ (silicon oxide), etc., may be used. The insulating films 44 are formed from deepest portions (the bottom surfaces 15 of the trenches 13) to opening ends (obverse surface 10 of the epitaxial layer 4) of the trenches 13 so as to span across the n⁻ type drift layer 8 and the n⁺ type obverse surface layer 9 exposed from the side surfaces 16. Also, each insulating film 44 is formed to cross a boundary of the p type layer 42 and the p⁺ type contact layer 43 in the lateral direction along the obverse surface 10 of the epitaxial layer 4. The p⁺ type contact layer 43 is thereby exposed as the bottom surface 15 of each trench 13 from between the insulating films 44 disposed at the respective side surfaces 16 of the trench 14. Each embedded portion 32 of the anode electrode 31 faces the n⁻ type drift layer 8 and the n⁺ type obverse surface layer 9 via the insulating films 44 while contacting the exposed portion of the p⁺ type contact layer 43.

The insulating film 44 of the semiconductor device 41 may be formed, for example, by processes shown in FIG. 5A to FIG. 5D.

Figure 5:
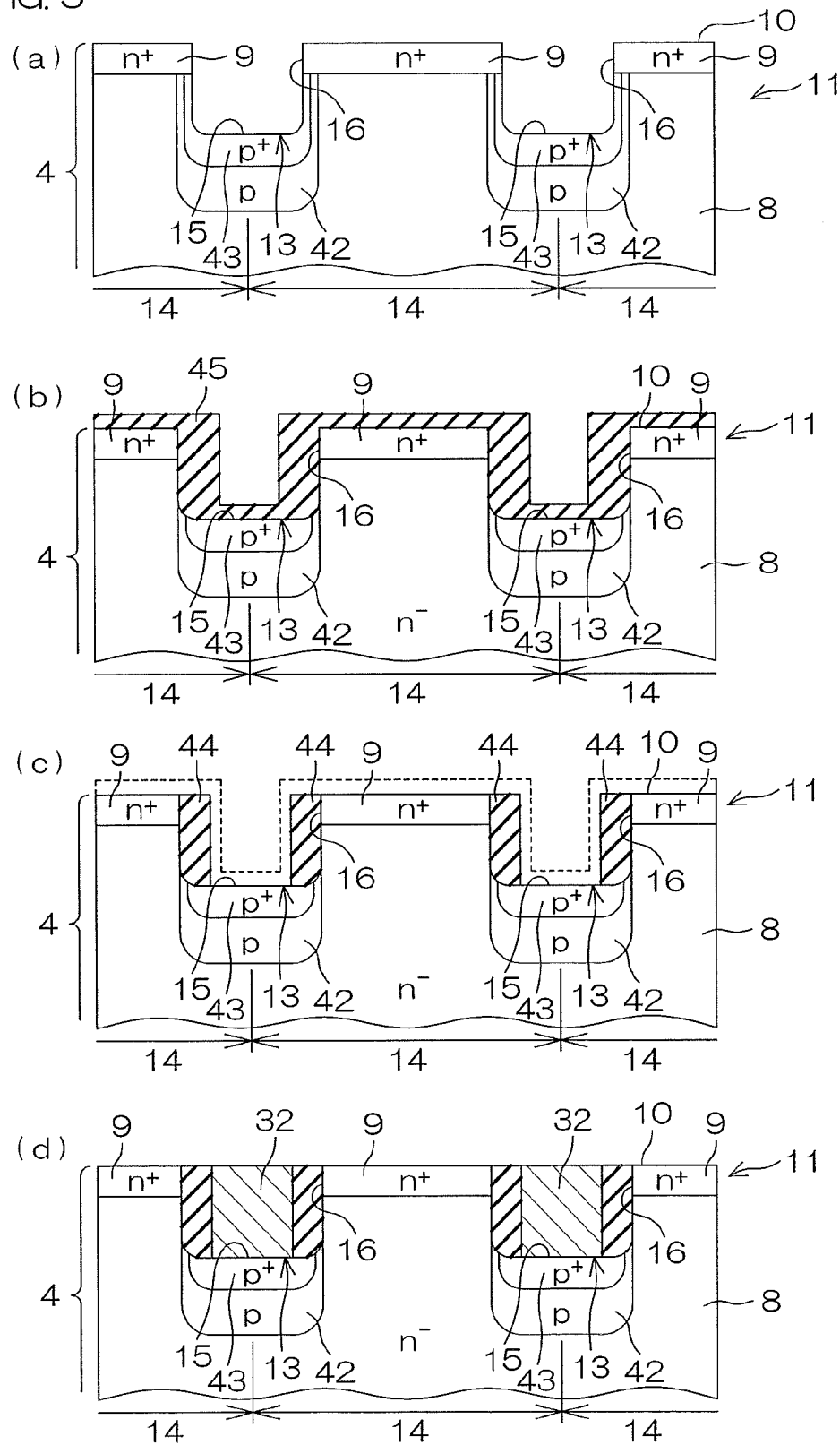
FIG. 5A to FIG. 5D are sectional views for describing processes related to forming an insulating film.

First, as shown in FIG. 5A, after growing the epitaxial layer 4, the trenches 13 are formed by dry etching and thereafter the p type layers 42 and the p⁺ type contact layers 43 are formed by ion implantation. In this process, ions are also implanted into the side surfaces 16 of the trenches 13 so that the p type layers 42 and the p⁺ type contact layers 43 are formed not only at the bottom surfaces 15 but also at the side surfaces 16 of the trenches 13.

Next, as shown in FIG. 5B, thermal oxidation of the epitaxial layer 4 is performed. Here, if the epitaxial layer 4 is formed on a (0001) plane (Si plane) of the n⁺ type substrate 2, an oxidation rate of the bottom surfaces 15 of the trenches 13 that are parallel to the Si plane will be lower than an oxidation rate of the side surfaces 16 of the trenches 13. An insulating film 45, having a film thickness difference of being thick at portions on the side surfaces 16 of the trench 13 and being thin at portions on the bottom surfaces 15, is thereby formed in conformance to the obverse surface 10 of the epitaxial layer 4 and the inner surfaces of the trenches 13 as shown in FIG. 5B. In this process, portions of the p type layers 42 and the p⁺ type contact layers 43 in the side surfaces 16 of the trenches 13 are thinner than portions in the bottom surfaces 15 and the oxidation of the side surfaces 16 of the trenches 13 thus progresses even faster in comparison to the bottom surfaces 15. The p type layers 42 and the p⁺ type contact layers 43 can thus be left just at the bottom surfaces 15 of the trenches 13 while transforming the p type layers 42 and the p⁺ type contact layers 43 formed at the side surfaces 16 of the trenches 13 entirely to the insulating film 45.

Next, as shown in FIG. 5C, relatively thin portions (portions at the bottom surfaces 15 of the trenches 13 and on the obverse surface 10 of the epitaxial layer 4) of the insulating film 45 are selectively removed by dry etching or wet etching. Relatively thick portions (portions on the side surfaces 16 of the trenches 13) of the insulating film 45 are thus left on the side surfaces 16 as the insulating films 44.

Next, as shown in FIG. 5D, the embedded portions 32 are embedded at inner sides of the insulating films 44 by plasma CVD, etc.

With the semiconductor device 41, while enabling depletion layers with a width $W_1$ to spread from pn junction portions at interfaces of the p type layers 42 and the n⁻ type drift layer 8, depletion layers with a width $N_2$, narrower than the width $W_1$, can be made to spread from interfaces of the insulating films 44 and the n⁻ type drift layer 8. This enables spreading of depletion layers 46, each having a plurality of different widths in the thickness direction of the epitaxial layer 4. Diverse rectifying operations can thereby be performed.

Obviously, the same effects as those of the semiconductor device 1 of the first preferred embodiment can also be achieved.

Figure 6:
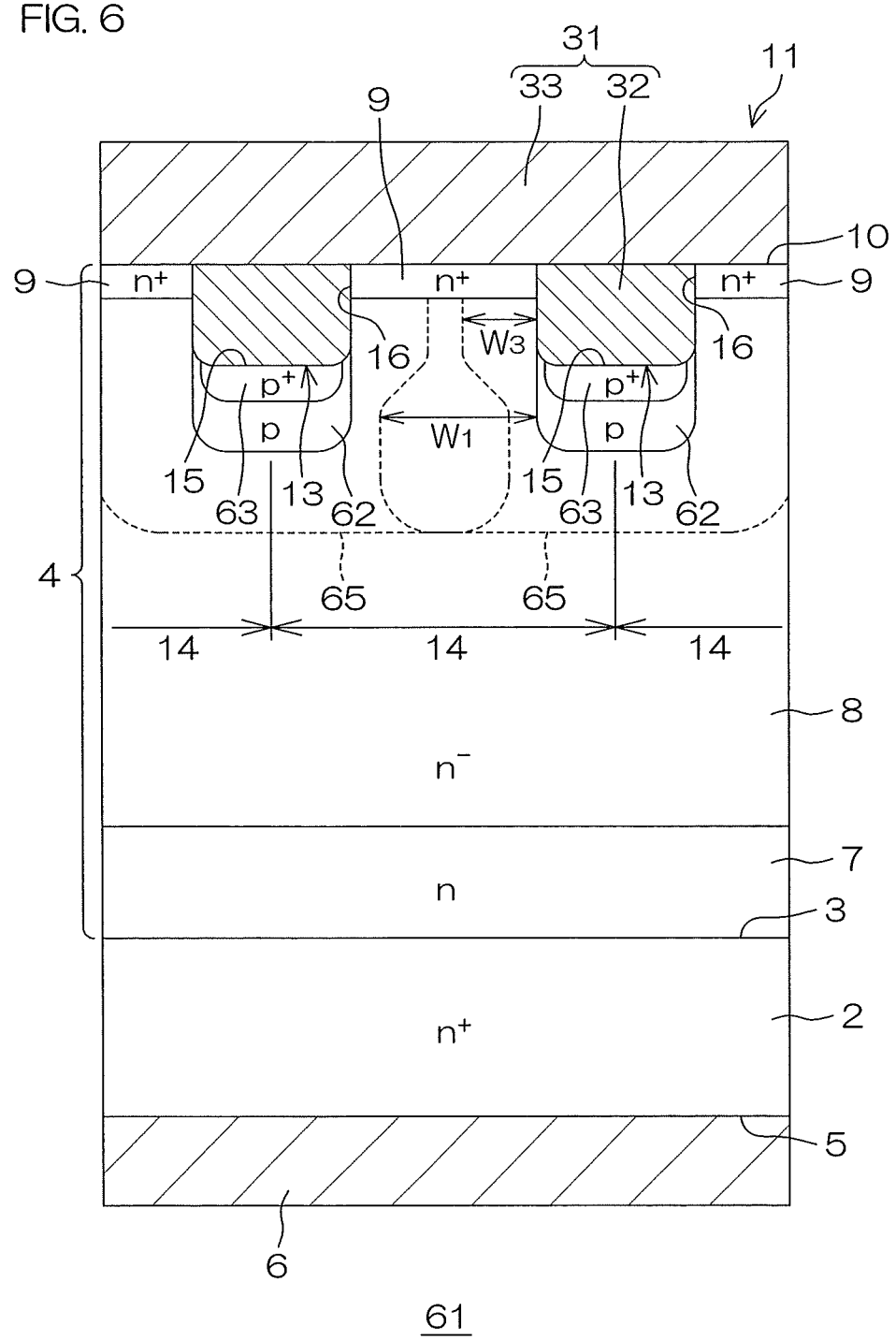
FIG. 6 is a schematic sectional view of a semiconductor device according to a third preferred embodiment of the present invention.

FIG. 6 is a schematic sectional view of a semiconductor device 61 according to a third preferred embodiment of the present invention. In FIG. 6, portions corresponding to respective portions shown in FIG. 3 described above are provided with the same reference symbols.

With the first preferred embodiment, the p type layer 17 is formed across the entire bottom surface 15 and at a portion of the side surfaces 16 of each trench 13 so that the n⁻ type drift layer 8 is not exposed from the side surfaces 16 of the trench 13. In contrast, the semiconductor device 61 of the third preferred embodiment includes a p type layer 62 formed at the bottom surface 15 of each trench 13 such that the n⁻ type drift layer 8 is selectively exposed from the side surfaces 16 of the trench 13. The p type layer 62 is formed, for example, with the same width as the trench 13 and along a longitudinal direction of the trench 13 at a lower region of the trench 13. Also, the p type layer 62 includes a p⁺ type contact layer 63 which, at an inner side spaced from a boundary of the p type layer 62 and the n⁻ type drift layer 8, is formed alongside the boundary at the bottom surface 15 of the trench 13.

Each embedded portion 32 of the anode electrode 31 contacts the p⁺ type contact layer 63 at the bottom surface 15 of a trench 13 and forms an ohmic contact with the p⁺ type contact layer 63. On the other hand, the embedded portion 32 contacts the n⁻ type drift layer 8 at the side surfaces 16 of the trench 13 and forms Schottky junctions with the n⁻ type drift layer 8.

The Schottky junction portions of the semiconductor device 61 may be formed, for example, by processes shown in FIG. 7A to FIG. 7D.

Figure 7:
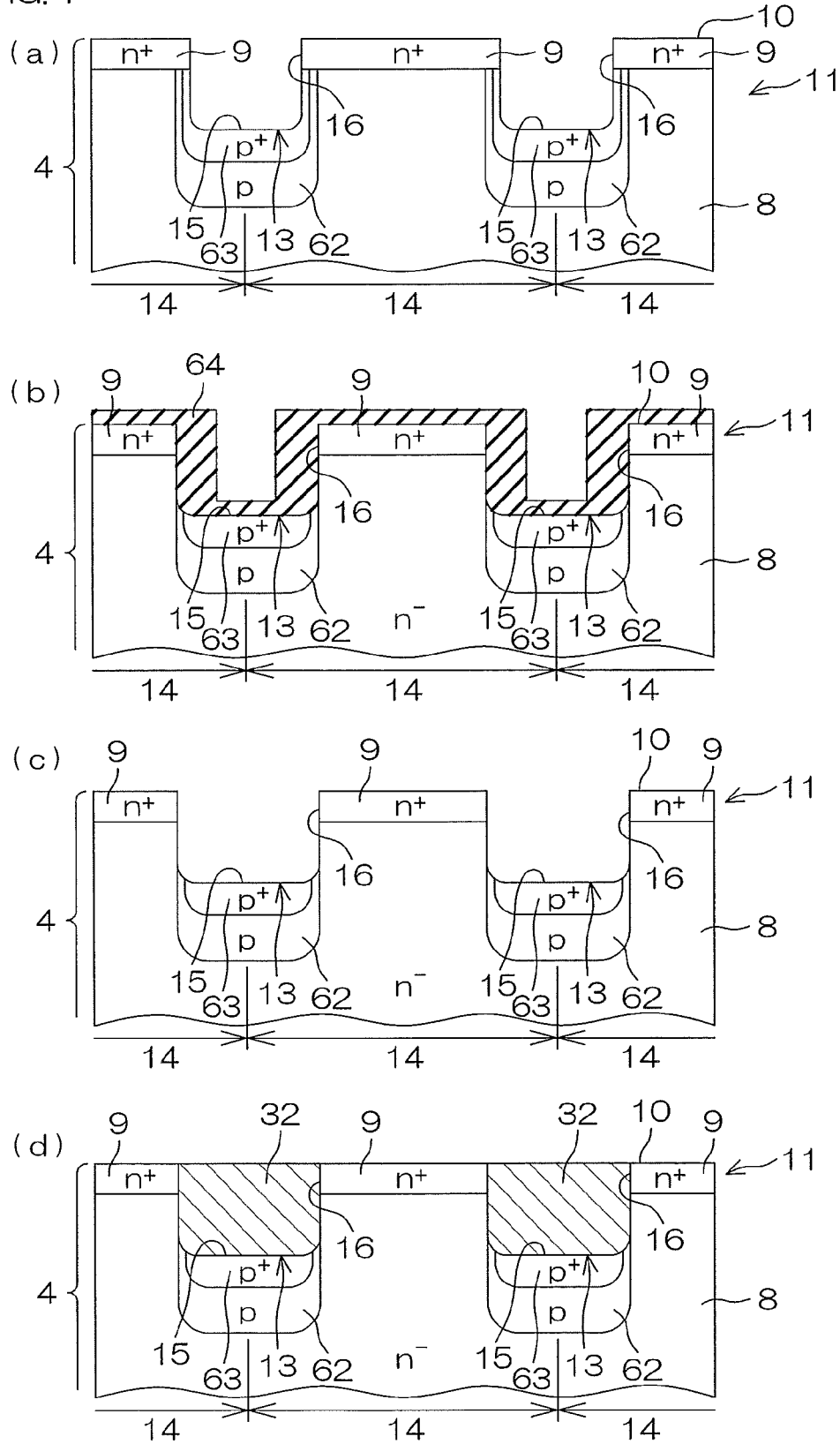
FIG. 7A to FIG. 7D are sectional views for describing processes related to forming of a Schottky junction.

First, as shown in FIG. 7A, after growing the epitaxial layer 4, the trenches 13 are formed by dry etching and thereafter the p type layers 62 and the p⁺ type contact layers 63 are formed by ion implantation. In this process, ions are also implanted into the side surfaces 16 of the trenches 13 so that the p type layers 62 and the p⁺ type contact layers 63 are formed not only at the bottom surfaces 15 but also at the side surfaces 16 of the trenches 13.

Next, as shown in FIG. 7B, thermal oxidation of the epitaxial layer 4 is performed. Here, if the epitaxial layer 4 is formed on a (0001) plane (Si plane) of the n⁺ type substrate 2, the oxidation rate of the bottom surfaces 15 of the trenches 13 that are parallel to the Si plane will be lower than the oxidation rate of the side surfaces 16 of the trenches 13. An insulating film 64, having a film thickness difference of being thick at portions on the side surfaces 16 of the trench 13 and being thin at portions on the bottom surfaces 15, is thereby formed in conformance to the obverse surface 10 of the epitaxial layer 4 and the inner surfaces of the trenches 13 as shown in FIG. 7B. In this process, portions of the p type layers 62 and the p⁺ type contact layers 63 in the side surfaces 16 of the trenches 13 are thinner than portions in the bottom surfaces 15 and the oxidation of the side surfaces 16 of the trenches 13 thus progresses even faster in comparison to the bottom surfaces 15. The p type layers 62 and the p⁺ type contact layers 63 can thus be left just at the bottom surfaces 15 of the trenches 13 while transforming the p type layers 62 and the p⁺ type contact layers 63 formed at the side surfaces 16 of the trenches 13 entirely to the insulating film 64.

Next, as shown in FIG. 7C, the entire insulating film 64 is removed by dry etching or wet etching. The n⁻ type drift layer 8 is thereby exposed from the side surfaces 16 of the trenches 13.

Next, as shown in FIG. 7D, the embedded portions 32 are embedded in the trenches 13 by plasma CVD, etc.

With the semiconductor device 61, while enabling depletion layers with a width $W_1$ to spread from pn junction portions at interfaces of the p type layers 62 and the n⁻ type drift layer 8, depletion layers with a width $W_3$, narrower than the width $W_1$, can be made to spread from Schottky junction portions at interfaces of the embedded portions 32 and the n⁻ type drift layer 8. This enables spreading of depletion layers 65, each having a plurality of different widths in the thickness direction of the epitaxial layer 4. Diverse rectifying operations can thereby be performed.

Obviously, the same effects as those of the semiconductor device 1 of the first preferred embodiment can also be achieved.

Although preferred embodiments of the present invention have been described above, the present invention may be implemented in other modes.

Figure 8:
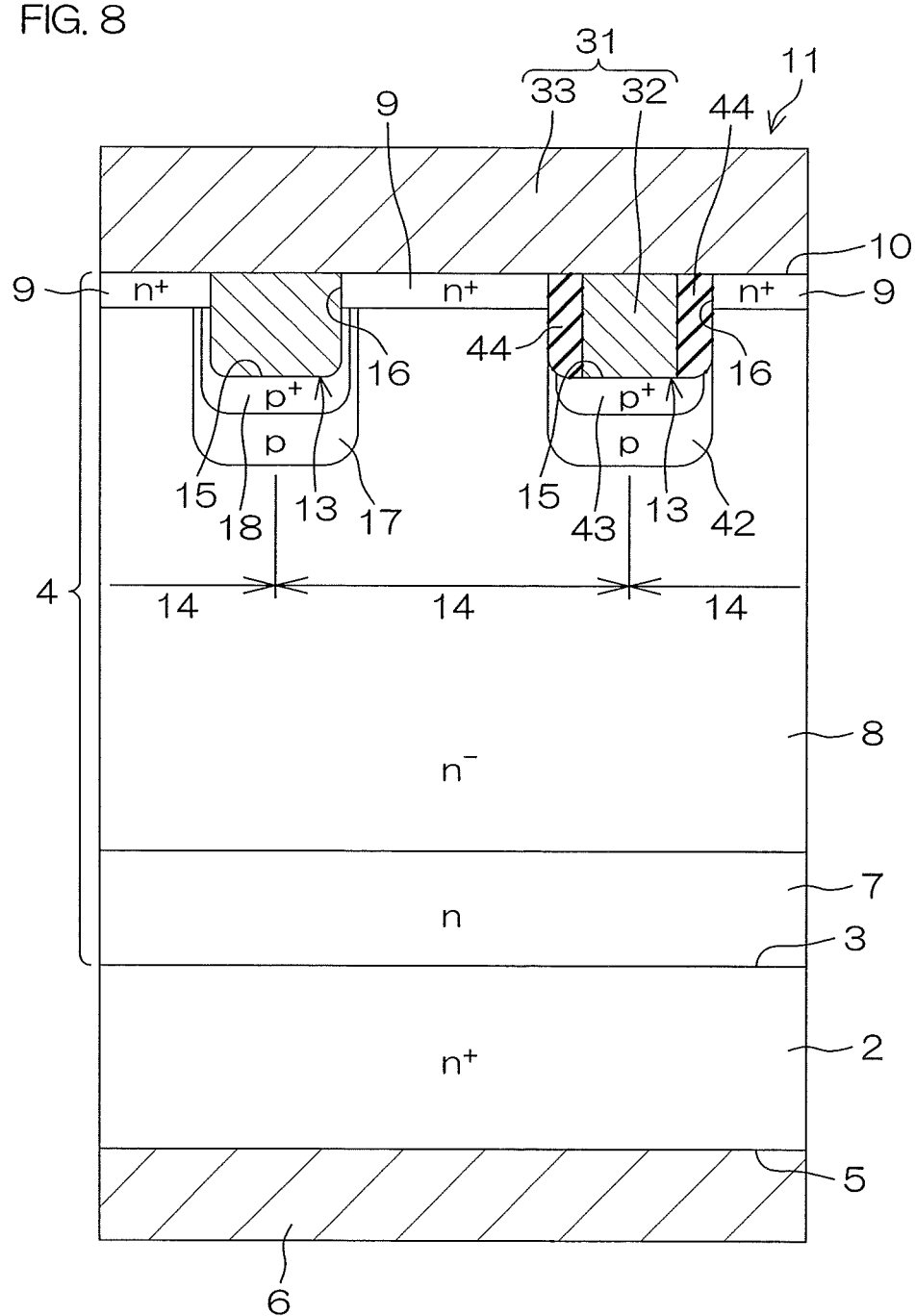
FIG. 8 is a schematic sectional view of a semiconductor device according to a fourth preferred embodiment of the present invention.

For example, the features ascertainable from the above disclosure of the preferred embodiments may be mutually combined even among different preferred embodiments. For example, the first preferred embodiment and the second preferred embodiment may be combined as in a semiconductor device 81 (fourth preferred embodiment) shown in FIG. 8.

Also, arrangements in which the conductivity types of the respective semiconductor portions of the semiconductor devices 1, 41, 61, and 81 are inverted may be adopted. For example, in the semiconductor device 1, a p type portion may be of an n type and an n type portion may be of a p type.

The semiconductor device (semiconductor power device) according to the present invention may, for example, be incorporated in a power module used in an inverter circuit forming a driving circuit for driving an electric motor used as a power source of an electric vehicle (including a hybrid vehicle), an electric train, an industrial robot, etc. It may also be incorporated in a power module used in an inverter circuit that converts electric power generated by a solar cell, a wind power generator, or other type of power generating apparatus (especially, a private power generating apparatus) so as to be matched with electric power generated by a commercial power source.

Besides the above, various design modifications may be made within the scope of the matters described in the claims.

The preferred embodiments of the present invention are merely specific examples used to clarify the technical contents of the present invention, the present invention should not be interpreted as being restricted to these specific examples, and the spirit and scope of the present invention are limited solely by the attached claims.

The present application corresponds to Japanese Patent Application No. 2012-282882 filed in the Japan Patent Office on Dec. 26, 2012, and the entire disclosure of this application is incorporated herein by reference.

DESCRIPTION OF THE SYMBOLS

1 Semiconductor device
2 n⁺ type substrate
4 Epitaxial layer
5 (n⁺ type substrate) reverse surface
6 Cathode electrode
7 n type buffer layer
8 n⁻ type drift layer
9 n⁺ type obverse surface layer
10 (Epitaxial layer) obverse surface
11 Active region
12 Outer peripheral region
13 Trench
14 Unit cell
15 (Trench) bottom surface
16 (Trench) side surface
17 p type layer
18 p⁺ type contact layer
19 Removal region
22 p type JTE structure
23 (Removal region) side surface
24 (Removal region) bottom surface
31 Anode electrode
32 Embedded portion
41 Semiconductor device
43 p type layer
43 p⁺ type contact layer
44 Insulating film
61 Semiconductor device
62 p type layer
63 p⁺ type contact layer
81 Semiconductor device

What is claimed is:

1. A semiconductor device comprising:
a semiconductor layer;
a trench formed selectively in an obverse surface portion of the semiconductor layer and defining a unit cell of predetermined shape in the obverse surface portion;
a second conductivity type layer formed to conform to a portion or an entirety of an inner surface of the trench;
an obverse surface layer of a first conductivity type formed so as to be exposed from an obverse surface of the semiconductor layer in the unit cell;
a reverse surface layer of the first conductivity type formed so as to be exposed from a reverse surface of the semiconductor layer;
a drift layer of the first conductivity type formed between the obverse surface layer and the reverse surface layer of the semiconductor layer and being of lower concentration than the obverse surface layer and the reverse surface layer;
a first electrode contacting the exposed part of the obverse surface layer and forming an ohmic contact with the obverse surface layer; and
a second electrode contacting the reverse surface layer and forming an ohmic contact with the reverse surface layer, wherein
the first electrode covers the obverse surface and includes an embedded portion that is embedded in the trench and
the embedded portion of the first electrode forms an ohmic contact with the second conductivity type layer.

2. The semiconductor device according to claim 1, wherein the second conductivity type layer is formed so that the drift layer is exposed from a portion of the inner surface of the trench and
the embedded portion forms a Schottky junction with the exposed drift layer.

3. The semiconductor device according to claim 1, further comprising an insulating film formed on a portion of the inner surface of the trench.

4. The semiconductor device according to claim 1, wherein the second conductive type layer includes a high concentration layer that is formed at a portion exposed from the inner surface of the trench and has a higher concentration compared to other portions of the second conductivity type layer.

5. The semiconductor device according to claim 4, wherein the embedded portion forms an ohmic contact with the high concentration layer.

6. The semiconductor device according to claim 1 wherein the embedded portion includes polysilicon, tungsten (W), titanium (Ti), or an alloy of the above materials.

7. The semiconductor device according to claim 1, wherein the semiconductor layer includes a wide bandgap semiconductor with a dielectric breakdown field of not less than 1.5 MV/cm.

8. The semiconductor device according to claim 7, wherein the wide bandgap semiconductor includes silicon carbide (SiC), gallium nitride (GaN), gallium oxide ($Ga_2O_3$), or diamond.

9. The semiconductor device according to claim 1, wherein the obverse surface of the semiconductor layer is defined into an active region in which the unit cell is disposed and an outer peripheral region surrounding the active region, and the semiconductor device further comprises:
a removal region formed in the obverse surface portion of the semiconductor layer in the outer peripheral region; and
a termination structure of the second conductivity type that is formed to conform to a portion or an entirety of an inner surface of the removal region and is disposed at a position deeper than the obverse surface layer.

10. The semiconductor device according to claim 9, wherein the termination structure includes a first portion formed to conform to a side surface and a bottom surface of the removal region, and a second portion formed outside the first portion.

11. The semiconductor device according to claim 10, wherein the second portion has a dopant concentration lower than that of the first portion.

12. The semiconductor device according to claim 10, the second portion includes a plurality of ring-shaped portions.

* * * * *